United States Patent [19]

Laut

[11] Patent Number: 4,700,274

[45] Date of Patent: Oct. 13, 1987

[54] RING-CONNECTED CIRCUIT MODULE ASSEMBLY

[75] Inventor: Marvin Laut, Dracut, Mass.

[73] Assignee: GTE Laboratories, Incorporated, Waltha, Mass.

[21] Appl. No.: 10,911

[22] Filed: Feb. 5, 1987

[51] Int. Cl.[4] ............................................... H05K 1/14
[52] U.S. Cl. .................................... 361/393; 361/395; 361/412; 361/413
[58] Field of Search ................. 361/393, 395, 412, 413

[56] References Cited

U.S. PATENT DOCUMENTS

| | | | |
|---|---|---|---|
| 3,657,701 | 4/1972 | Garth | 361/412 X |
| 3,727,168 | 4/1973 | Henschen et al. | 361/398 X |
| 3,800,097 | 3/1974 | Maruscak et al. | 361/413 X |
| 3,808,505 | 4/1974 | Reimer | 361/413 |
| 4,307,438 | 12/1981 | Grubb | 361/412 X |
| 4,420,793 | 12/1983 | Strandberg | 361/413 |
| 4,511,950 | 4/1985 | Bunner et al. | 361/412 X |
| 4,575,780 | 3/1986 | Brombal et al. | 361/412 X |

Primary Examiner—R. R. Kucia
Attorney, Agent, or Firm—Wolf, Greenfield & Sacks

[57] ABSTRACT

A ring-connected circuit module assembly wherein signals are regenerated at each circuit module is provided in a single row of parallel circuit modules. The assembly provides short interconnection lengths and facilitates access and servicing of the circuit modules. Circuit modules of a first set alternate in the assembly with circuit modules of a second set. Adjacent circuit modules in the first set are interconnected, adjacent circuit modules in the second set are interconnected and a circuit module of the first set is interconnected with the adjacent module of the second set at each end of the row to form a ring-connection of the circuit modules. The maximum interconnection length is twice the distance between adjacent circuit modules.

8 Claims, 4 Drawing Figures

RING-CONNECTED CIRCUIT MODULE ASSEMBLY

FIELD OF THE INVENTION

This invention relates to a circuit module assembly capable of high speed operation and, more particularly, to a ring-connected circuit module assembly having a single row of parallel circuit boards with short interconnection lengths.

BACKGROUND OF THE INVENTION

Bus structures are widely used for interconnecting printed circuit boards in digital systems such as computers and switching systems. In bus systems, signals are commonly connected to each circuit board in the system. The load and parasitic capacitances of each circuit board and interconnection add to the load on each driver circuit. As a result, for each additional circuit board, additional drive capability is required to prevent reduction of operating speed. In addition, the bus operating speed is limited by the time to transmit signals over the maximum length of the bus.

Bus interconnection systems are satisfactory for many applications. However, when it is necessary to utilize a large number of circuit boards in a system, such as in a telecommunications switching system, the speed of a bus system is reduced to an unacceptable extent. To overcome the problems of bus systems, ring interconnection systems have been proposed. (See, for example, J. M. Lenart, "A High Performance Satellite BaseBand Switching Technique," MILCOM 1984 Conference Record, Vol. 1, pp. 13-15 and J. M. Lenart et al, "A Ring Based Satellite Switch," Proc. from ICEC 1984, Vol. 1, pp. 216-218.) In a ring-connected switching system, signals are regenerated at each printed circuit board and are transmitted to the next adjacent circuit board. The connections are closed in a loop, or ring, so that signals propagate successively to each circuit board. At each circuit board, signals can be removed from the ring, introduced onto the ring or simply passed through the next circuit board on the ring. An advantage of the ring-connected system is that a large number of nodes can be utilized without reducing the system clock speed. In a ring-connected system having N nodes, or circuit boards, the time to transfer information from one circuit board to another is equal to or less than N clock cycles, the average being N/2 clock cycles. Each driver has only a single load in the ring-connected system regardless of the number of nodes.

To achieve high operating speed, it is necessary to minimize the distance between each circuit board. A conventional circuit board or card rack of parallel circuit boards has been undesirable for ring-connected systems since opposite ends of the card rack must be connected together to form a ring. Other circuit card configurations have been proposed to achieve the ring connection while minimizing wiring length. In one approach, a circular backplane is utilized and printed circuit boards are plugged in radially to form a spoke-type arrangement. This configuration achieves short interconnection lengths but is highly impractical, both as to construction and maintenance. A similar approach utilizes two conventional card racks mounted back-to-back with adjacent ends connected together to form an electrical ring. This configuration also achieves short interconnections but is impractical, since printed circuit boards must be accessed from two directions and the required space is relatively large. A third configuration utilizes two conventional card racks mounted one above the other with adjacent ends connected together. This configuration does not provide the desired short interconnections.

It is an object of the present invention to provide an improved, ring-connected circuit module assembly.

It is another object of the present invention to provide a ring-connected circuit module assembly utilizing a printed circuit board assembly having a single row of parallel circuit boards.

It is a further object of the present invention to provide a ring-connected circuit module assembly having short interconnections between circuit modules.

It is another object of the present invention to provide a ring-connected circuit module assembly wherein all circuit modules are accessible from one direction for easy servicing.

It is a further object of the present invention to provide a ring-connected circuit module assembly having relatively low cost and low space requirements.

SUMMARY OF THE INVENTION

According to the present invention, these and other objects and advantages are achieved in a ring-connected circuit assembly comprising a plurality of circuit modules including a first set of circuit modules and a second set of circuit modules, means for mounting the circuit modules in a row in generally parallel, closely-spaced alignment with circuit modules of the first set alternating with circuit modules of the second set. Adjacent circuit modules in the first set are interconnected, adjacent circuit modules in the second set are interconnected, and a circuit module of the first set is interconnected with the adjacent circuit module of the second set at each end of the row, thereby forming a ring-connection of the circuit modules.

In a preferred embodiment, the circuit modules are printed circuit boards provided with printed circuit board connectors, and the mounting means comprises a backplane including backplane connectors for engaging each of the printed circuit board connectors. The backplane connectors are interconnected by conductive traces on a backplane printed circuit board.

In a ring-connected configuration, each of the backplane connectors includes input pins and output pins. The input pins on each backplane connector in the first set are interconnected with the output pins on one adjacent backplane connector in the first set, the connections being made in succession to form a first portion of an electrical ring. The input pins on each backplane connector in the second set are interconnected with the output pins on one adjacent backplane connector in the second set, the connections being made in succession to form a second portion of the electrical ring. As a result, a ring-connected configuration is provided in a conventional card rack having one row of parallel printed circuit boards.

BRIEF DESCRIPTION OF THE DRAWINGS

For a better understanding of the present invention, together with other and further objects, advantages and capabilities thereof, reference is made to the accompanying drawings which are incorporated herein by reference and in which.

DETAILED DESCRIPTION OF THE INVENTION

Figure 1:
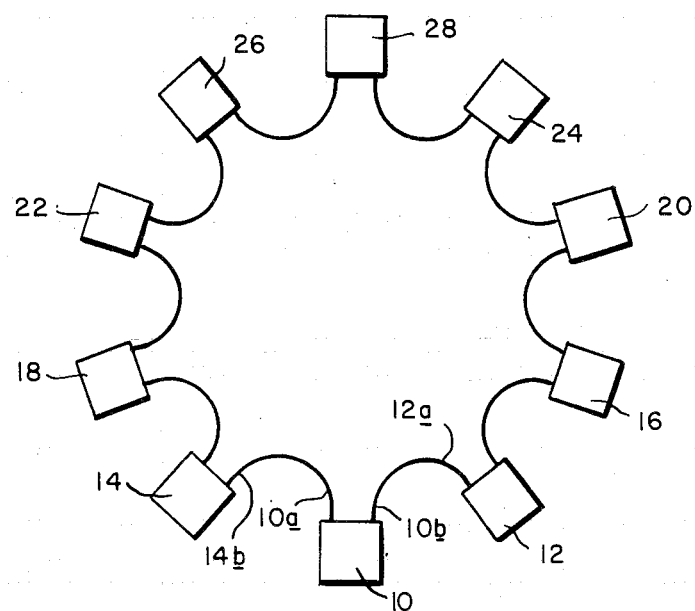
FIG. 1 is a schematic diagram of a ring-connected circuit assembly.

A ring-connected circuit configuration is shown in schematic form in FIG. 1. The configuration includes a plurality of circuit modules 10, 12, 14, 16, 18, 20, 22, 24, 26, 28, each having one or more inputs, 10a, and one or more outputs, 10b. Each circuit module 10-28 includes means for regenerating the ring signals, means for extracting signals from the ring and means for introducing signals onto the ring. The details of the regenerating circuitry are outside the scope of the present invention. Each circuit module has its outputs connected to the inputs of the adjacent circuit module on one side and has its inputs connected to the outputs of the adjacent circuit module on the other side. Thus, with reference to FIG. 1, outputs 10b of circuit module 10 are connected to inputs 12a of circuit module 12, and inputs 10a of circuit module 10 are connected to outputs 14b of circuit module 14. The same manner of connection is utilized around the ring to form a closed loop.

The ring-connected configuration of FIG. 1 has the advantage that the maximum interconnection length is the distance between adjacent circuit modules, thereby reducing parasitic capacitance and increasing the maximum operating speed. However, the circular ring configuration is not convenient for a compact and practical physical layout.

Figure 2:
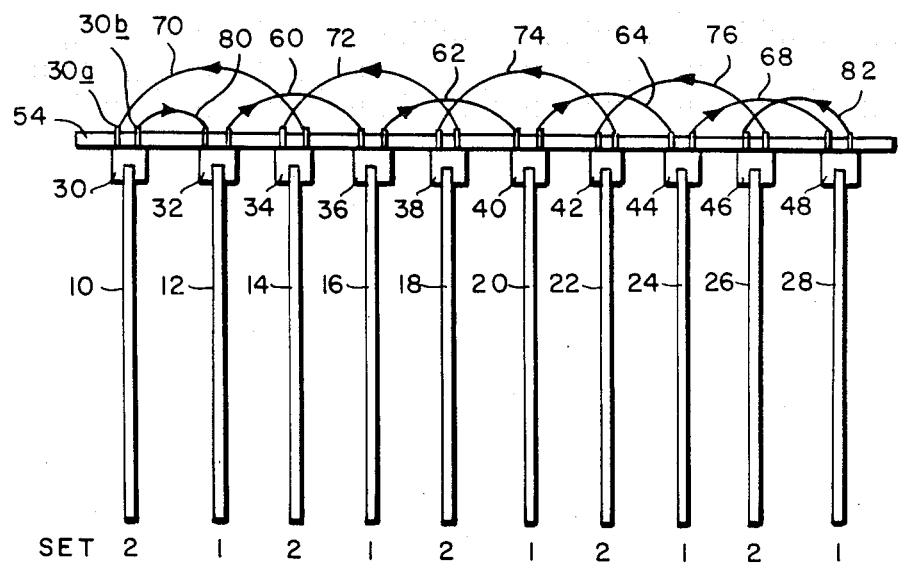
FIG. 2 is a schematic diagram of a ring-connected circuit module assembly in accordance with the present invention.

Referring now to FIG. 2, there is shown a ring-connected circuit module assembly in accordance with the present invention. The circuit modules 10, 12, 14, 16, 18, 20, 22, 24, 26, 28 are typically printed circuit boards having edge connectors. The circuit boards 10-28 are plugged into backplane connectors 30, 32, 34, 36, 38, 40, 42, 44, 46, 48, respectively. The backplane connectors 30-48 are mounted on a backplane printed circuit board 54 in a conventional manner, such that when the printed circuits boards 10-28 are plugged into the connectors 30-48, they form a row and are positioned in generally parallel, closely-spaced, side-by-side alignment. The circuit board assembly typically includes a frame (not shown) for supporting the backplane printed circuit board 54 and the printed circuit boards 10-28, and card guides (not shown) mounted on the frame for maintaining the spacing between printed circuit boards.

To aid in the understanding of the present invention, the circuit boards shown in FIG. 2 are divided into two sets, a first set comprising circuit boards 12, 16, 20, 24 and 28, and a second set comprising circuit boards 10, 14, 18, 22 and 26. Similarly, the backplane connectors are divided into a first set comprising connectors 32, 36, 40, 44 and 48 and a second set comprising connectors 30, 34, 38, 42 and 46. The sets are defined such that circuit boards of the first set alternate with circuit boards of the second set in the circuit board assembly. Similarly, backplane connectors of the first set alternate with backplane connectors of the second set. Each of the connectors 30-48 includes input pins and output pins. For example, backplane connector 30 includes input pins 30a. and output pins 30b. The remaining connectors have similar sets of input pins and output pins. Usually, each backplane connector includes multiple input pins and multiple output pins.

The backplane connectors 30-48 in the assembly of FIG. 2 are connected in a ring configuration wherein the maximum wiring length is twice the distance between adjacent connectors. Adjacent circuit boards in the first set are interconnected and adjacent circuit boards in the second set are interconnected. At the ends of the row, a circuit board in the first set is interconnected with the adjacent board in the second set. In the first set, circuit boards 12 and 16 are interconnected by lead 60, circuit boards 16 and 20 are interconnected by lead 62, circuit boards 20 and 24 are interconnected by lead 64 and circuit boards 24 and 28 are interconnected by lead 68. In the second set, circuit boards 10 and 14 are interconnected by lead 70, circuit boards 14 and 18 are interconnected by lead 72, circuit boards 18 and 22 are interconnected by lead 74 and circuit boards 22 and 26 are interconnected by lead 76. In each case, the outputs of one circuit board are connected to the inputs of the adjacent board in the same set. At the left end of the row of circuit boards, circuit board 10 of the second set is interconnected by a lead 80 to adjacent circuit board 12 of the first set. At the right end of the row, circuit board 28 of the first set is interconnected by a lead 82 to adjacent circuit board 26 of the second set. The arrows on each of the leads 60-82 shown in FIG. 2 indicate a connection from an output to an input. Although each connection between circuit boards has been represented as a single line, it will be understood that a practical circuit assembly will include multiple electrical connections between each circuit board.

The connections 60-82 shown and described above constitute a ring-connected circuit board assembly, electrically equivalent to that shown in FIG. 1. The maximum length of any interconnection is twice the distance between adjacent backplane connectors (equal to the distance between adjacent backplane connectors in each set). As a result, the advantages of a ring-connected configuration can be realized in a conventional circuit card rack having a single row of parallel circuit boards. Circuit boards 10-28 are accessed from one direction and impractical circular or back-to-back configurations are avoided.

It will be understood that the interconnections 60-82 can use individual wiring, coaxial cable or printed circuit conductors. In a preferred embodiment, the interconnections are printed circuit conductors on the backplane printed circuit board 54 as described hereinafter. It will also be understood that the backplane connectors 30-48 can be of any desired type and that the circuit modules 10-28 can be printed circuit boards, hybrid circuits or any other desired type of circuit module. In the case where point-to-point wiring between backplane connectors is utilized (for example, wire wrap connections) a backplane circuit board is not utilized and the connectors are mounted to the frame. Any number of circuit modules can be utilized in the ring-connected assembly.

Figure 3:
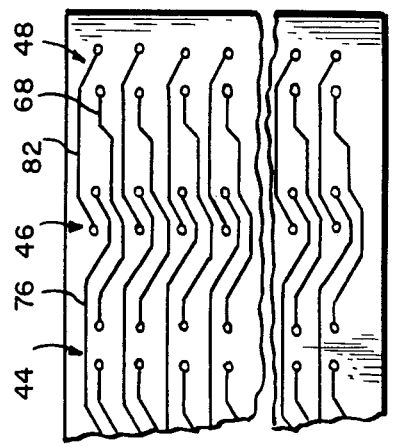
FIG. 3 illustrates a backplane interconnection layout in accordance with the present invention.
Figure 3:
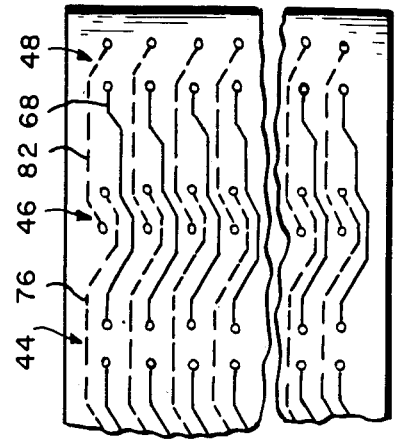
Figure 3:
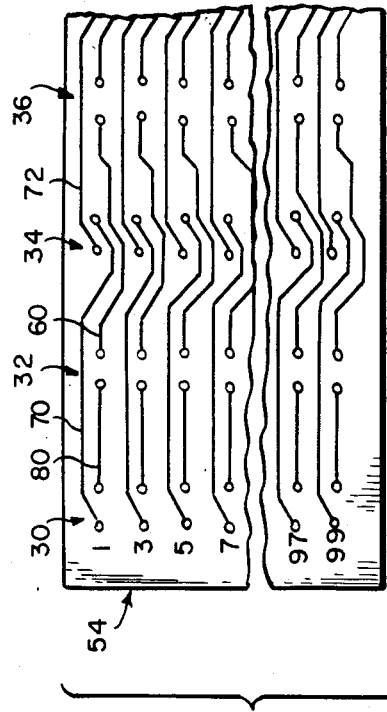

One interconnection layout of the backplane printed circuit board 54 is shown in FIG. 3. Each backplane connector 30-48 is represented by two columns of connector pins 1, 3, 5, 7, ... 97, 99. The wiring for each set of pins corresponds to that shown in FIG. 2 and described hereinabove so that a ring-connected configuration is provided. In this embodiment, all printed circuit traces are on one printed circuit layer. This layout requires two conductors between some connector pins, thereby limiting the spacing between connector pins to on the order of 0.100 inch.

Figure 4:
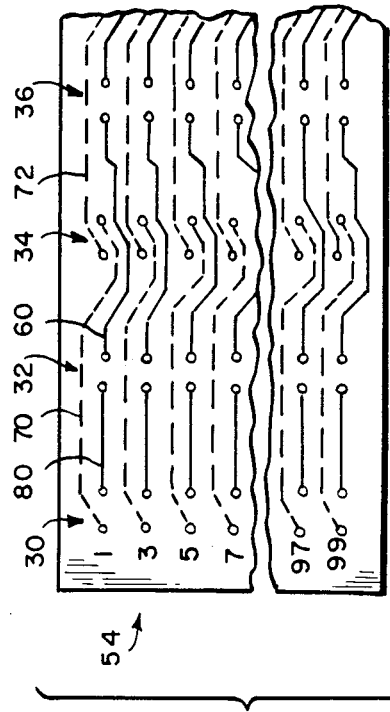
FIG. 4 illustrates a backplane interconnection layout in accordance with another embodiment of the present invention.

Another interconnection layout of the backplane printed circuit board 54 is shown in FIG. 4. This embodiment provides the same electrical connections as shown in FIG. 3, but utilizes a two-layer backplane printed circuit board 54. Conductors of the two layers are represented by solid and dotted lines, respectively. The advantage of this configuration is that only one conductor is required to pass between connector pins, thereby permitting use of connectors with closely-spaced pins.

While there has been shown and described what is at present considered the preferred embodiments of the present invention, it will be obvious to those skilled in the art that various changes and modifications may be made therein without departing from the scope of the present invention as defined by the appended claims.

What is claimed is:

1. A ring-connected circuit module assembly comprising:
    a plurality of circuit modules including a first set of circuit modules and a second set of circuit modules;
    means for mounting said circuit modules in a row in generally parallel, closely-spaced alignment with circuit modules of said first set alternating with circuit modules of said second set; and
    connecting means for interconnecting adjacent circuit modules in said first set, for interconnecting adjacent circuit modules in said second set and for interconnecting one circuit module of said first set to the adjacent circuit module of said second set at each end of said row, thereby forming a ring connection of said circuit modules.

2. A circuit assembly as defined in claim 1 wherein said circuit modules comprise printed circuit boards provided with printed circuit board connectors.

3. A circuit assembly as defined in claim 2 wherein said mounting means comprises a backplane including backplane connectors for engaging each of said printed circuit board connectors.

4. A circuit assembly as defined in claim 3 wherein said connecting means comprises a backplane printed circuit board on which said backplane connectors are mounted.

5. A ring-connected circuit board assembly comprising:
    a plurality of circuit boards each having a printed circuit board connector;
    a plurality of backplane connectors for engaging each of said printed circuit board connectors;
    means for mounting said backplane connectors so that, when said circuit boards are engaged therein, said circuit boards form a row with said circuit boards positioned in generally parallel, closely-spaced, side-by-side alignment;
    said backplane connectors including a first set and a second set, backplane connectors of the first set alternating in said row with backplane connectors of the second set;
    first means for interconnecting adjacent backplane connectors of the first set;
    second means for interconnecting adjacent backplane connectors of the second set; and
    third means for interconnecting one backplane connector of the first set with the adjacent backplane connector of the second set at each end of said row.

6. A circuit board assembly as defined in claim 5 wherein each of said backplane connectors includes input pins and output pins, and said first interconnecting means includes means for interconnecting the input pins on each backplane connector in the first set with the output pins on one adjacent backplane connector in the first set, said backplane connectors of the first set being connected in succession to form a first portion of an electrical ring connection.

7. A circuit board assembly as defined in claim 6 wherein said second interconnecting means includes means for interconnecting the input pins on each backplane connector in the second set with the output pins on one adjacent backplane connector in the second set, said backplane connectors of the second set being connected in succession to form a second portion of the electrical ring connection.

8. A circuit board assembly as defined in claim 7 wherein said mounting means comprises a backplane printed circuit board having said backplane connectors mounted thereon and wherein said first, said second and said third interconnecting means comprise conductive traces on said backplane printed circuit board.

* * * * *